(12) United States Patent
Gardner et al.

(10) Patent No.: US 6,204,148 B1
(45) Date of Patent: Mar. 20, 2001

(54) METHOD OF MAKING A SEMICONDUCTOR DEVICE HAVING A GROWN POLYSILICON LAYER

(75) Inventors: Mark I. Gardner, Cedar Creek; H. Jim Fulford; Derick J. Wristers, both of Austin, all of TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/329,843

(22) Filed: Jun. 11, 1999

(51) Int. Cl.[7] .................................................. H01L 21/76
(52) U.S. Cl. ...................... 438/430; 438/197; 438/229; 438/230; 438/429; 438/585; 438/595
(58) Field of Search .................................. 438/197, 221, 438/222, 229, 230, 429, 430, 432, 585, 595

(56) References Cited

U.S. PATENT DOCUMENTS

| | | | |
|---|---|---|---|
| 5,108,945 | * | 4/1992 | Matthews ................................ 437/60 |
| 5,963,818 | * | 10/1999 | Kao et al. ............................. 438/424 |
| 6,040,214 | * | 3/2000 | Boyd et al. ........................... 438/244 |

FOREIGN PATENT DOCUMENTS

0409681 A1 * 1/1991 (EP) ........................... H01L/21/338

60-234375 * 11/1985 (JP) ............................... H01L/29/80

* cited by examiner

*Primary Examiner*—Eddie C. Lee
*Assistant Examiner*—N. Drew Richards
(74) *Attorney, Agent, or Firm*—Williams, Morgan & Amerson, P.C.

(57) ABSTRACT

A partially formed semiconductor device includes a substrate, a first layer, a layer of polysilicon, and a grown layer of polysilicon. The first layer is positioned above at least a portion of the substrate. The layer of polysilicon is positioned above at least a portion of the first layer and has a first opening formed therein. The first opening has a first width that is defined by a plurality of sidewalls. The grown layer of polysilicon is positioned adjacent at least the plurality of sidewalls and the grown layer of polysilicon defines a second opening. The second opening has a second width with the second width being less than the first width. A method for partially forming a semiconductor device includes forming a process layer above at least a portion of a substrate. A layer of polysilicon is formed above at least a portion of the process layer. An opening is formed in the layer of polysilicon, and the opening has a first width that is defined by a plurality of sidewalls. The first width of the opening is reduced to a second width by growing a layer of polysilicon adjacent at least a portion of the sidewalls of the opening.

27 Claims, 3 Drawing Sheets

METHOD OF MAKING A SEMICONDUCTOR DEVICE HAVING A GROWN POLYSILICON LAYER

BACKGROUND OF THE INVENTION

1. Field of the Invention

This invention relates generally to the field of semiconductor processing, and, more particularly, to a method of making a semiconductor device having a grown polysilicon layer that assists in transistor scaling.

2. Description of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor, e.g., channel length, junction depths, gate dielectric thickness, etc., are reduced. For example, all other things being equal, the smaller the channel length of the transistor, the faster the transistor will operate. Thus, there is a constant drive to reduce the size or scale of the components of a typical transistor to increase the overall speed of the transistor, as well as integrated circuit devices incorporating such transistors.

Typically, the feature size of integrated circuit components (e.g., transistors) may be determined during the semiconductor manufacturing process using a variety of masking techniques, such as photolithography. Photolithography may be used to selectively isolate very small regions on the surface of a wafer. Generally, photolithography comprises coating the wafer with a photosensitive layer, such as a photoresist. The photoresist may then be selectively exposed to light through a master pattern on a photographic plate. The exposed portions of the photoresist may be developed and removed revealing selected areas of semiconductor material for further processing. In this manner, very fine integrated circuit components, such as the channel length of a field effect transistor, may be determined. Unfortunately, transistors and other semiconductor devices are desired with feature sizes smaller than photolithography and other masking techniques are capable of producing.

The present invention is directed to overcoming, or at least reducing the effects of, one or more of the problems set forth above.

SUMMARY OF THE INVENTION

One aspect of the present invention is seen in a partially formed semiconductor device including a substrate, a first layer, a layer of polysilicon, and a grown layer of polysilicon. The first layer is positioned above at least a portion of the substrate. The layer of polysilicon is positioned above at least a portion of the first layer and has a first opening formed therein. The first opening has a first width that is defined by a plurality of sidewalls. The grown layer of polysilicon is positioned adjacent at least the plurality of sidewalls and the grown layer of polysilicon defines a second opening. The second opening has a second width with the second width being less than the first width.

Another aspect of the present invention is seen in a method for partially forming a semiconductor device. The method includes forming a process layer above at least a portion of a substrate. A layer of polysilicon is formed above at least a portion of the process layer. An opening is formed in the layer of polysilicon, and the opening has a first width that is defined by a plurality of sidewalls. The first width of the opening is reduced to a second width by growing a layer of polysilicon adjacent at least a portion of the sidewalls of the opening.

BRIEF DESCRIPTION OF THE DRAWINGS

The invention may be best understood by reference to the following description taken in conjunction with the accompanying drawings, in which like reference numerals identify like elements, and in which.

Figure 1:
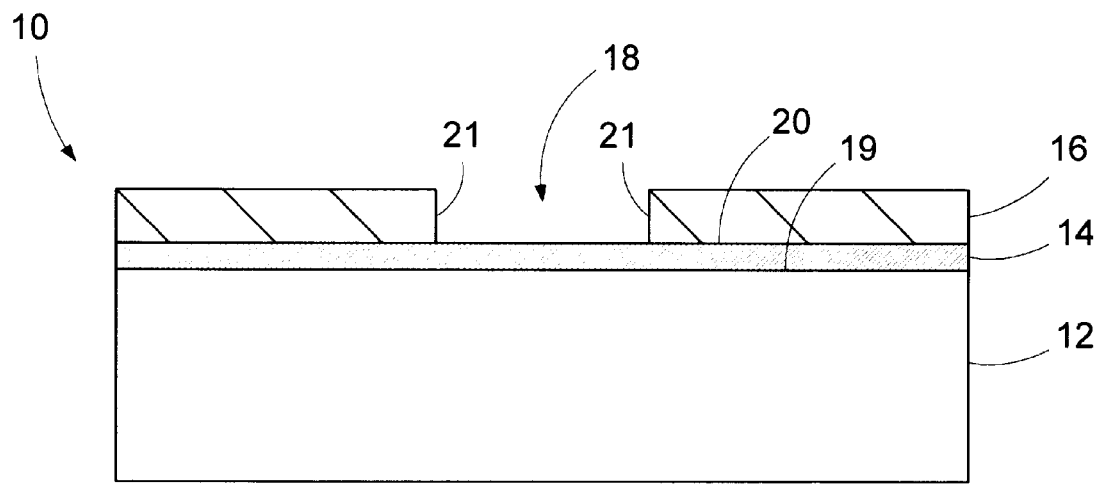
FIG. 1 is a cross-sectional view of an illustrative partially formed semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–6. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

In FIG. 1, an illustrative embodiment of a partially formed field effect transistor 10 is shown. The transistor 10 is comprised of a substrate 12, a process layer 14, and a polysilicon layer 16 having an opening 18 formed therein. Those skilled in the art will appreciate that the substrate 12 may be comprised of a variety of semiconductor materials. In one embodiment, the substrate 12 is comprised of silicon.

The process layer 14 may be formed above a surface 19 of the substrate 12 using a variety of known techniques. For example, the process layer 14 may be thermally grown, deposited, etc. As will be readily appreciated by one skilled in the art upon a complete reading of the present application, the process layer 14 may be used as either a sacrificial layer or it may be used as the final gate dielectric for the completed transistor. In one illustrative embodiment, the process layer 14 is comprised of a deposited layer of silicon dioxide having a thickness ranging from approximately 100–300 Å. Alternatively, the process layer 14 may be comprised of a thermally grown layer of silicon dioxide having a thickness ranging from approximately 15–30 Å.

The polysilicon layer 16 may be formed above a surface 20 of the process layer 14 using a variety of known techniques. For example, the polysilicon layer 16 may be deposited using, among other things, a low pressure chemical vapor deposition (LPCVD) at a temperature ranging from approximately 580–640° C. In addition, the polysilicon layer 16 may be doped with impurity atoms, such as boron, arsenic, or other like materials. In one embodiment, the polysilicon layer 16 is comprised of a deposited layer of undoped polysilicon having a thickness that ranges from approximately 1000–2000 Å.

Once deposited above the surface 20 of the process layer 14, the polysilicon layer 16 may be patterned to define the opening 18 having a plurality of sidewalls 21. Those skilled in the art will appreciate that a variety of known techniques may be used to form the opening 18 in the polysilicon layer 16. For example, the polysilicon layer 16 may be patterned using traditional photolithography and etching techniques. Furthermore, it is contemplated that the opening 18 may be patterned and etched to have a width that is approximately equal to the minimum feature size capable of being produced with known patterning technologies (i.e., the width of the opening 18 may be formed as small as possible.) In one embodiment, the opening 18 may be formed having a width of approximately 2000 Å. Alternatively, it is contemplated that the opening 18 may be formed having a variety of widths, and the size and dimensions of the opening 18 may vary depending upon the application.

Figure 2:
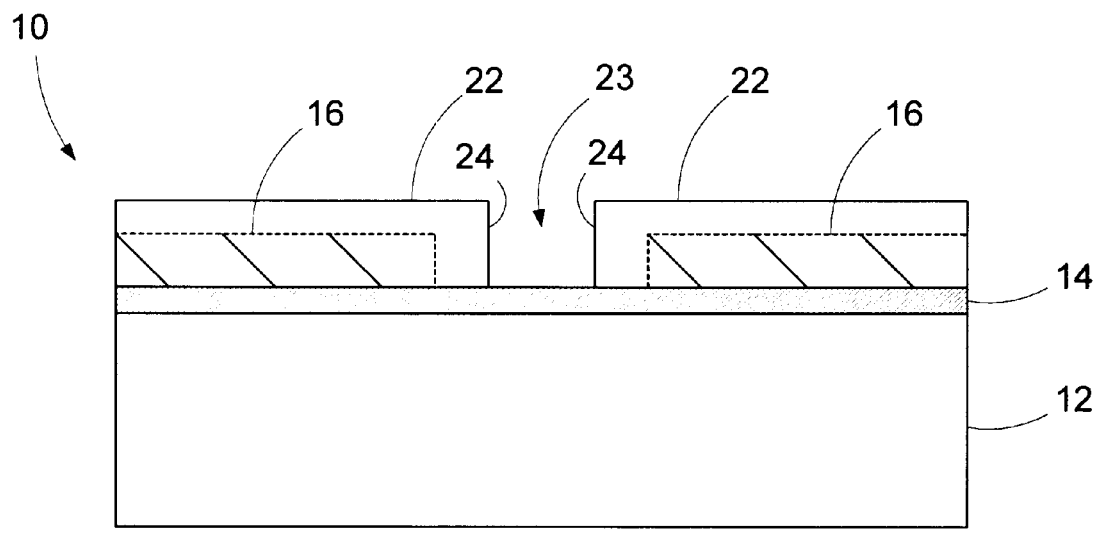
FIG. 2 is a cross-sectional view of the device of FIG. 1 after a sacrificial epitaxial layer has been formed on parts thereof in accordance with the present invention.
Figure 3:
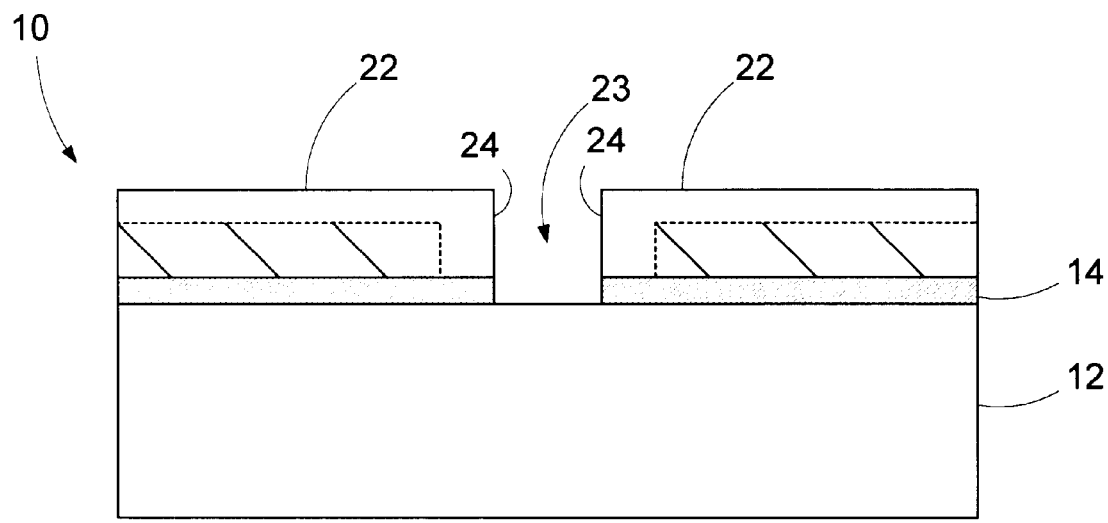
FIG. 3 is a cross-sectional view of the device of FIG. 2 after a portion of oxide layer has been selectively removed in accordance with the present invention.

Next, as shown in FIG. 2, the width of the opening 18 may be reduced by forming a second layer 22 above the polysilicon layer 16. That is, the second layer 22 is formed to define an opening 23 having sidewalls 24. In one embodiment, the second layer 22 is comprised of a grown layer of polysilicon that is grown both vertically and laterally above the surface of the polysilicon layer 16 (i.e., the second layer 22 is shown surrounding the polysilicon layer 16.) Because the process layer 14 is virtually immune to the growth of polysilicon, the second layer 22 does not form above the portion of the process layer 14 lying within the opening 18 during the process of growing the second layer 22.

By growing the second layer 22, the width of the opening 18, shown in FIG. 1, may be reduced to the width of the final opening 23, shown in FIG. 2, in a controlled manner. In addition, it is contemplated that the width of the final opening 23 may vary depending upon the particular application. For example, in one embodiment of the present invention, the opening 23 may be formed having a width of approximately 150–300 Å.

The second layer 22 may be grown using a variety of known techniques. For example, the second layer 22 may be grown in the presence of silane gas ($SiH_4$), dichlorosilane ($SiH_2Cl_2$), etc. at a temperature of approximately 800–1000° C. In addition, the process of growing the second layer 22 may be carried out in a rapid thermal anneal (RTA) chamber for a time period of approximately 30–90 seconds. Alternatively, it is contemplated that the second layer 22 may be grown in a batch furnace for a time period of approximately 1–10 minutes.

There are at least two alternatives for forming a gate dielectric in the opening 23. One way to accomplish such an objective is to initially form the process layer 14 from the desired gate dielectric material and to the desired final thickness of the gate dielectric. For example, the process layer 14 may be comprised of a thermally grown layer of silicon dioxide having a thickness ranging from approximately 15–30 Å. In this embodiment, after the formation of the opening 23, the gate dielectric for the completed transistor is comprised of the portion of the process layer 14 isolated between the sidewalls 24 of the opening 23. Alternatively, the process layer 14 may be formed of a material and/or to a thickness that is undesirable for use as a gate dielectric. In this embodiment, the portion of the process layer 14 isolated between the sidewalls 24 of the opening 23 is, in effect, a sacrificial layer that may be removed prior to formation of a gate dielectric. For example, in one illustrative embodiment, the portion of the process layer 14 isolated between the sidewalls 24 of the opening 23 may be removed using an anisotropic etching process, which results in the structure depicted in FIG. 3.

Figure 4:
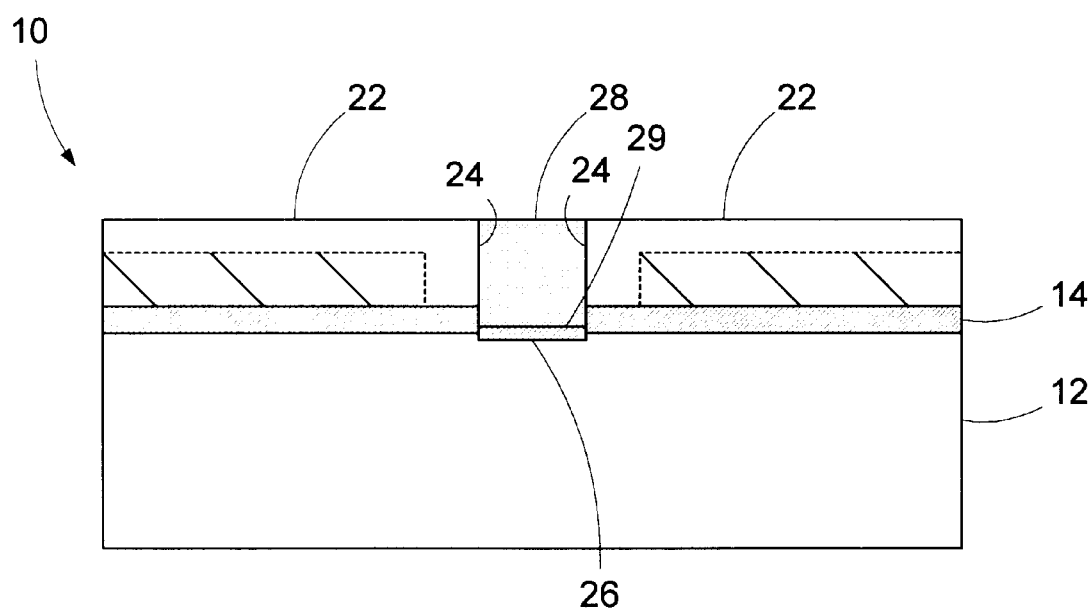
FIG. 4 is a cross-sectional view of the device of FIG. 3 after a gate oxide and a gate conductor has been formed on parts thereof in accordance with the present invention.

Next, as shown in FIG. 4, a gate dielectric 26 may be formed on the exposed portion of the substrate 12 isolated between the sidewalls 24 of the opening 23. Those skilled in the art will appreciate that the gate dielectric 26 may be formed using a variety of known techniques. For example, the gate dielectric 26 may be thermally grown, deposited using CVD, etc. Furthermore, the gate dielectric 26 may be comprised of a variety of materials, such as silicon dioxide ($SiO_2$), nitrogen-bearing silicon dioxide, silicon oxynitride, and any like material. In one embodiment, the gate dielectric 26 is comprised of a thermally grown layer of silicon dioxide having a thickness ranging from approximately 15–30 Å.

Once the gate dielectric 26 is formed, by either alternative technique presented above, it is contemplated that a gate conductor 28 may be formed above the gate dielectric 26 between the sidewalls 24 of the opening 23. Those skilled in the art will appreciate that the gate conductor 28 may be comprised of a variety of materials such as, polysilicon, metal, and any like material. In one embodiment, it is contemplated that the gate conductor 28 may be comprised of a variety of metals, such as copper, tantalum, titanium nitride, tantalum nitride, tungsten, and any other like metal. Those skilled in the art will appreciate that the gate conductor 28 may be formed using a variety of known techniques, such as CVD, LPCVD, sputtering, etc. In one embodiment, the gate conductor 28 is comprised of tantalum that is deposited inside the opening 23 above the gate dielectric 26 and on the surface 29 of the process layer 22 using a CVD process. Thereafter, a chemical mechanical polish (CMP) may be performed to complete the formation of the gate conductor 28.

Figure 5:
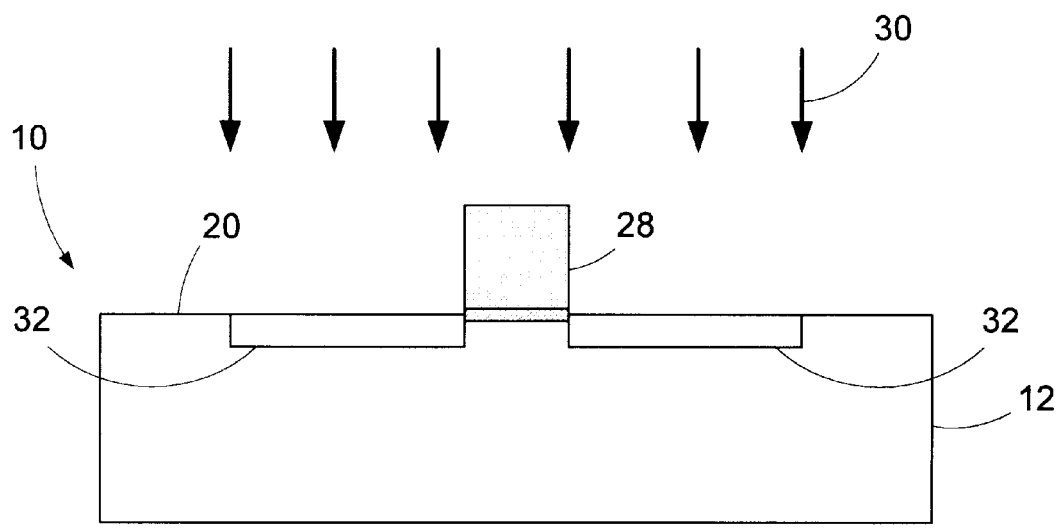
FIG. 5 is a cross-sectional view of the device of FIG. 4 after lightly doped regions have been formed therein.

In FIG. 5, once the gate conductor 28 is formed, the second layer 22, the polysilicon layer 16, and the process layer 14 may be removed exposing the underlying substrate 12 for further processing. Those skilled in the art will appreciate that the second layer 22, the polysilicon layer 16, and the process layer 14 may be removed using a variety of know techniques, such as etching. Once exposed, the surface 20 of the substrate 12 may be subjected to a first ion implantation process, as indicated by arrows 30. Those skilled in the art will appreciate that the first ion implantation process may be used to form lightly doped regions 32 in the substrate 12. The doping material used may vary depending upon the application. In one embodiment, the lightly doped regions 32 are doped with arsenic (for NMOS technology), and the doping concentration ranges from approximately $8 \times 10^{13} - 2 \times 10^{15}$ ions/cm$^2$ at an energy level of approximately 2–10 keV.

Figure 6:
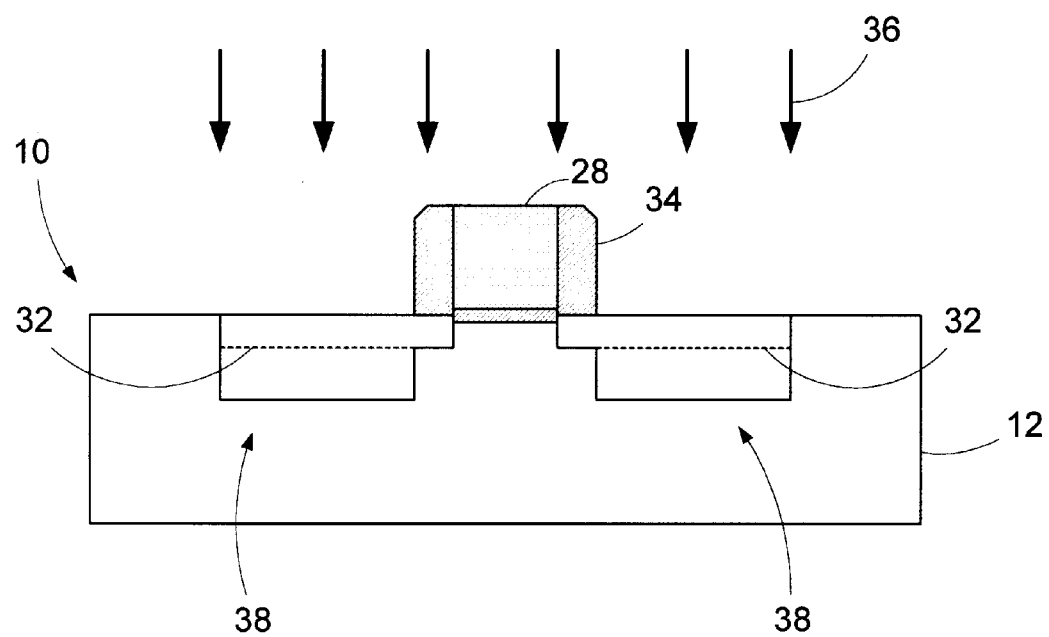
FIG. 6 is a cross-sectional view of the device of FIG. 5 after source/drain regions have been formed therein.

In FIG. 6, a plurality of sidewall spacers 34 may be formed adjacent the gate conductor 28 by the deposition of a conformal layer of the appropriate spacer material over the gate conductor 28 followed by an anisotropic etch of the conformal layer. The sidewall spacers 34 may be comprised of a variety of materials, such as silicon dioxide (SiO$_2$), silicon nitride, silicon oxynitride, and any other like material. In one embodiment, the sidewall spacers 34 are comprised of silicon dioxide (SiO$_2$) and are formed with a width of approximately 500–1000 Å.

Once the sidewall spacers 34 are formed, the substrate 12 may be subjected to a second ion implantation, as indicated by arrows 36. Those skilled in the art will appreciate that the second ion implantation may be used to complete the formation of source/drain regions 38. Once the second ion implantation is completed, the source/drain regions 38 are formed having the familiar lightly doped drain (LDD) structure, shown in FIG. 6. In one embodiment, the concentration of dopant atoms during the second ion implantation process may range from approximately $4 - 9 \times 10^{15}$ ions/cm$^2$ at an energy level of approximately 5–20 keV. Again, it is contemplated that the appropriate dopant atoms for the first and second ion implantation process may be selected for the appropriate technology involved (e.g., arsenic for NMOS technology, boron for PMOS technology.)

Next, the surfaces of the source/drain regions 38 and gate conductor 28 may be subjected to salicidation to form silicide above the exposed polysilicon surfaces. Once the transistor 10 is formed, conventional processes may be followed to connect the gate conductor 28 and the source/drain regions 38 with external circuitry.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of partially forming a semiconductor device, comprising:

forming a process layer above at least a portion of a substrate;

forming a layer of polysilicon above at least a portion of the process layer;

forming an opening in the layer of polysilicon, the opening having a first width defined by a plurality of sidewalls; and reducing the first width of the opening to a second width by growing a layer of polysilicon adjacent at least a portion of the sidewalls of the opening.

2. The method of claim 1, wherein forming the opening in the layer of polysilicon comprises etching an opening in the layer of polysilicon.

3. The method of claim 1, wherein forming the process layer comprises forming a layer of silicon dioxide having a thickness of approximately 100–300 Å.

4. The method of claim 1, wherein forming the process layer comprises forming a layer of silicon dioxide having a thickness of approximately 15–30 Å.

5. The method of claim 1, further comprising forming a gate dielectric comprised of a portion of the process layer positioned between the sidewalls of the opening.

6. The method of claim 5, further comprising forming a gate conductor above the gate dielectric.

7. The method of claim 1, further comprising removing a portion of the process layer positioned under the second opening and forming a gate dielectric above the substrate.

8. The method of claim 5, further comprising forming a gate conductor above the gate dielectric.

9. The method of claim 1, wherein reducing the first width of the opening comprises growing the layer of polysilicon in the presence of silane gas at a temperature of approximately 800–1000° C.

10. The method of claim 9, wherein growing the layer of polysilicon comprises growing the layer of polysilicon in a rapid thermal anneal chamber for approximately 30–90 seconds.

11. The method of claim 9, wherein growing the layer of polysilicon comprises growing the layer of polysilicon in a furnace for approximately 1–10 minutes.

12. The method of claim 1, wherein forming the opening in the layer of polysilicon comprises masking and etching at least a portion of the layer of polysilicon with the first width of the opening having dimensions of approximately 2000 Å.

13. The method of claim 1, wherein reducing the first width of the opening comprises growing the polysilicon layer on at least a portion of the sidewalls of the opening, the second width of the opening having dimensions of approximately 150–300 Å.

14. A method, comprising:

forming a process layer above at least a portion of a substrate;

forming a layer of polysilicon above at least a portion of process layer;

forming an opening in the layer of polysilicon, the opening having a first width defined by a plurality of sidewalls;

reducing the first width of the opening to a second width by growing the layer of polysilicon adjacent at least a portion of the sidewalls of the opening; and forming a gate conductor above the process layer within the opening.

15. The method of claim 14, wherein forming the process layer comprises forming a layer of silicon dioxide having a thickness of approximately 15–30 Å.

16. The method of claim 14, wherein reducing the first width of the opening comprises growing the layer of polysilicon in the presence of silane gas at a temperature of approximately 800–1000° C.

17. The method of claim 16, wherein growing the layer of polysilicon comprises growing the layer of polysilicon in a rapid thermal anneal chamber for approximately 30–90 seconds.

18. The method of claim 16, wherein growing the layer of polysilicon comprises growing the layer of polysilicon in a furnace for approximately 1–10 minutes.

19. The method of claim 14, wherein forming the opening in the layer of polysilicon comprises masking and etching at least a portion of the layer of polysilicon with the first width of the opening having dimensions of approximately 2000 Å.

20. The method of claim 14, wherein reducing the first width of the opening comprises growing the layer of polysilicon on at least a portion of the sidewalls of the opening, the second width of the opening having dimensions of approximately 150–300 Å.

21. A method, comprising:

forming a process layer above at least a portion of a substrate;

forming a layer of polysilicon above at least a portion of process layer;

forming an opening in the layer of polysilicon, the opening having a first width defined by a plurality of sidewalls;

reducing the first width of the opening to a second width by growing the layer of polysilicon adjacent at least a portion of the sidewalls of the opening;

removing a portion of the process layer positioned under the opening having a second width;

forming a gate dielectric above the substrate; and forming a gate conductor above the gate dielectric.

22. The method of claim 21, wherein forming the process layer comprises forming a layer of silicon dioxide having a thickness of approximately 100–300 Å.

23. The method of claim 21, wherein reducing the first width of the opening comprises growing the layer of polysilicon in the presence of silane gas at a temperature of approximately 800–1000° C.

24. The method of claim 23, wherein growing the layer of polysilicon comprises growing the layer of polysilicon in a rapid thermal anneal chamber for approximately 30–90 seconds.

25. The method of claim 23, wherein growing the layer of polysilicon comprises growing the layer of polysilicon in a furnace for approximately 1–10 minutes.

26. The method of claim 21, wherein forming the opening in the layer of polysilicon comprises masking and etching, at least a portion of the layer of polysilicon with the first width of the opening having dimensions of approximately 2000 Å.

27. The method of claim 21, wherein reducing the first width of the opening comprises growing the layer of polysilicon on at least a portion of the sidewalls of the opening, the second width of the opening having dimensions of approximately 150–300 Å.

* * * * *